(12) United States Patent
Kameyama et al.

(10) Patent No.: US 7,495,881 B2
(45) Date of Patent: Feb. 24, 2009

(54) CHUCKING METHOD AND PROCESSING METHOD USING THE SAME

(75) Inventors: Kojiro Kameyama, Gunma (JP); Akira Suzuki, Gunma (JP); Yoshio Okayama, Sunnyvale, CA (US); Mitsuo Umemoto, Gunma (JP)

(73) Assignees: Sanyo Electric Co., Ltd., Osaka (JP); Kanto Sanyo Semiconductors Co., Ltd., Gunma (JP)

( * ) Notice: Subject to any disclaimer, the term of this patent is extended or adjusted under 35 U.S.C. 154(b) by 0 days.

(21) Appl. No.: 11/287,484

(22) Filed: Nov. 28, 2005

(65) Prior Publication Data

US 2006/0120010 A1    Jun. 8, 2006

(30) Foreign Application Priority Data

Nov. 30, 2004   (JP) ............................. 2004-345275

(51) Int. Cl.
*H01L 21/683* (2006.01)
*H01T 23/00* (2006.01)
*H05F 3/00* (2006.01)
*F41B 15/04* (2006.01)
*H01G 7/02* (2006.01)

(52) U.S. Cl. ........................ 361/234; 361/231; 361/232; 361/233

(58) Field of Classification Search .......... 361/231–234
See application file for complete search history.

(56) References Cited

U.S. PATENT DOCUMENTS

| | | | |
|---|---|---|---|
| 6,693,790 B2* | 2/2004 | Matsuki et al. | 361/234 |
| 6,864,957 B2 | 3/2005 | Van Elp et al. | |
| 7,068,489 B2* | 6/2006 | Migita | 361/234 |
| 2003/0223030 A1* | 12/2003 | Byun et al. | 349/187 |
| 2005/0074952 A1* | 4/2005 | Miyamoto et al. | 438/455 |

FOREIGN PATENT DOCUMENTS

| | | |
|---|---|---|
| EP | 1 191 581 | 3/2002 |
| JP | 62-275137 | 11/1987 |
| JP | 62275137 | 11/1987 |
| JP | 05063062 | 3/1993 |

(Continued)

OTHER PUBLICATIONS

European Search Report mailed Nov. 19, 2007, directed to counterpart EP application No. 05026071.

*Primary Examiner*—Stephen W Jackson
*Assistant Examiner*—Dharti H Patel
(74) *Attorney, Agent, or Firm*—Morrison & Foerster LLP

(57) ABSTRACT

The invention provides an electrostatically chucking technology capable of chucking a workpiece formed of an insulator or a workpiece attached with an object to be processed such as a semiconductor wafer on a stage. A layered body attached with a glass substrate for supporting a semiconductor substrate having an electronic device on its surface is prepared, and a conductive film is attached thereto. Then, the layered body is set on a surface of a stage set in a vacuum chamber such as a dry-etching apparatus. After then, a voltage is applied to an internal electrode to generate positive and negative electric charges on the surfaces of the conductive film and the stage, and the layered body is chucked with static electricity generated therebetween. Then, the layered body chucked on the stage is processed by etching, CVD, or PVD.

32 Claims, 6 Drawing Sheets

FOREIGN PATENT DOCUMENTS

| | | |
|---|---|---|
| JP | 05-331431 | 12/1993 |
| JP | 05331431 | 12/1993 |
| JP | 10-206876 | 8/1998 |
| JP | 2002-305234 | 10/2002 |
| WO | WO-97/23945 | 7/1997 |

* cited by examiner

CHUCKING METHOD AND PROCESSING METHOD USING THE SAME

CROSS-REFERENCE OF THE INVENTION

This invention is based on Japanese Patent Application No. 2004-345275, the content of which is incorporated by reference in its entirety.

BACKGROUND OF THE INVENTION

1. Field of the Invention

The invention relates to an electrostatic chucking technology used in a semiconductor device manufacturing process or a liquid crystal panel manufacturing process.

2. Description of the Related Art

In the semiconductor device manufacturing process, an electrostatic chucking method is used as a method of chucking a semiconductor wafer on a stage of an etching apparatus and so on in each of processes such as etching, CVD (chemical vapor deposition), PVD (physical vapor deposition), and so on. This electrostatic chucking method is to apply a voltage between a stage and a semiconductor wafer set on this stage with a dielectric layer therebetween to chuck the semiconductor wafer on the stage with static electricity generated therebetween.

In this electrostatic chucking method, however, on principle, since it is necessary to use the stage as one electrode and a workpiece (e.g. a semiconductor wafer) as another electrode, an insulator can not be chucked on the stage as the workpiece. For example, since an insulation substrate is used in a device of SOS (silicon-on-sapphire) or SOI (silicon-on-insulator), high chucking force such as obtained by the semiconductor wafer can not be obtained and thus the electrostatic chucking method can not be used for such a device. Furthermore, since a FPD (flat-panel display) or a DVD (digital video disk) uses an insulation substrate such as a glass substrate, too, the electrostatic chucking technology can not be used for these.

The relevant technology is disclosed in the Japanese Patent Application Publications Nos. Hei. 5-63062, Hei. 5-331431, and Sho. 62-275137.

As described above, in an electrostatic chucking type apparatus, a workpiece formed of an insulator can not be chucked on a stage. Therefore, it is necessary to chuck such a workpiece by a mechanical clamp mechanism in an apparatus that performs processes in a vacuum state, such as a etching apparatus, a CVD apparatus, or a PVD apparatus. However, such a clamp mechanism causes instability of the temperature distribution in the workpiece and reduction of processing accuracy by the workpiece warping, thereby reducing the yield. For solving this, an electrostatic chucking technology capable of chucking a workpiece formed of an insulator or a workpiece attached with an object to be processed such as a semiconductor wafer on the stage has been required.

SUMMARY OF THE INVENTION

The invention provides a method of chucking. The method includes providing an object having a surface portion that is made of an insulator, attaching a member with a conductive layer to the surface portion, placing the object to which the member is attached in a vacuum chamber, and chucking the object to a stage provided in the vacuum chamber by generating electrostatic charges between the member and the stage.

The invention provides another method of chucking. The method includes providing an object for chucking, attaching a substrate made of an insulator to the object, attaching a member with a conductive layer to the substrate, placing the object to which the member and the substrate are attached in a vacuum chamber, and chucking the object to a stage provided in the vacuum chamber by generating electrostatic charges between the member and the stage.

The invention also provides a method of processing objects. The method includes providing an object having a surface portion that is made of an insulator, attaching a member with a conductive layer to the surface portion, placing the object to which the member is attached in a vacuum chamber, chucking the object to a stage provided in the vacuum chamber by generating electrostatic charges between the member and the stage, and processing the object chucked to the stage in the vacuum chamber.

The invention provides another method of processing an object. The method includes attaching a substrate made of an insulator to the object, attaching a member with a conductive layer to the substrate, placing the object to which the member and the substrate are attached in a vacuum chamber, chucking the object to a stage provided in the vacuum chamber by generating electrostatic charges between the member and the stage, and processing the object chucked to the stage in the vacuum chamber.

DETAILED DESCRIPTION OF THE INVENTION

Figure 1A:
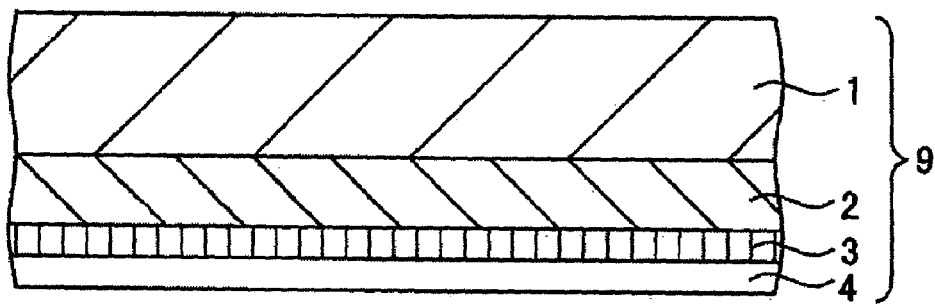
FIGS. 1A, 1B, and 1C are cross-sectional views of a conductive film used in an embodiment of the invention.
Figure 1B:
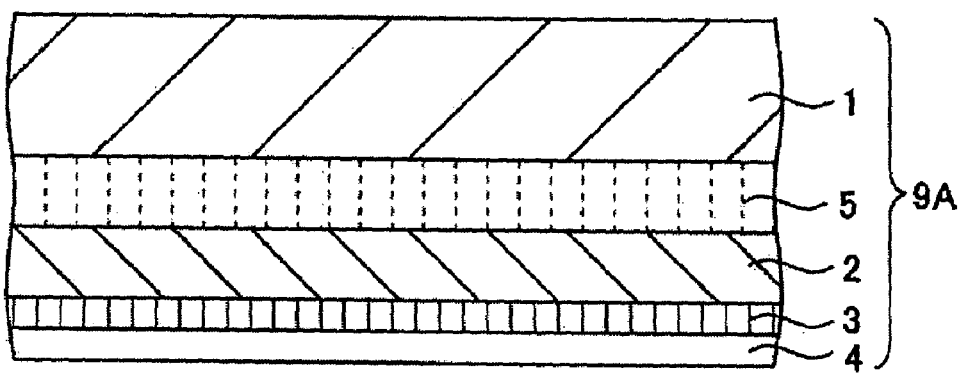

First, a conductive film used in an embodiment of the invention will be described as an example of a conductive member with reference to figures. FIGS. 1A, 1B, and IC are cross-sectional views showing a structure of the conductive film.

A conductive film 9 shown in FIG. 1A is formed of a protection layer 1, a conductive layer 2, an attachment layer 3, and a separation layer 4 laminated in this order. Alternatively, the conductive film 9 is formed of the protection layer 1, the conductive layer 2, a polyimide layer 5, the attachment layer 3, and the separation layer 4 laminated in this order. The protection layer 1 is a plastic film formed of a plastic material such as polyethylene, polypropylene, polyvinyl chloride, polystyrene, polyethylene terephthalate, polyacrylonitrile, or the like. The conductive layer 2 is formed of a conductive polymer containing conjugated double bonds in its molecular structure, such as polypyrrole or the like. The attachment layer 3 is formed of an adhesive such as an acrylic type adhesive, a urethane type adhesive, a synthetic rubber type adhesive, or the like. The separation layer 4 is a release paper or the like, and separated when the conductive film 9 is used.

The conductive film 9A shown in FIG. 1B is formed of the protection layer 1, the polyimide layer 5, the conductive layer 2, the attachment layer 3, and the separation layer 4 laminated in this order. Since polyimide has high thermal resistance, using the conductive film having such high thermal resistance can provide stable chucking characteristics even at high temperature.

Figure 1C:
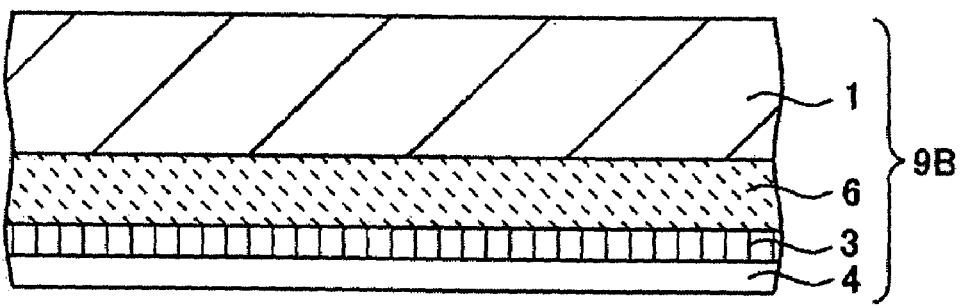

The conductive film 9B shown in FIG. 1C is formed of the protection layer 1, a polymer layer 6 formed by polymerizing a conductive material and polyimide, the attachment layer 3, and the separation layer 4 laminated in this order. The attachment layer 3 in FIGS. 1B and 1C is preferably formed of a material having thermal resistance.

Next, an chucking of the embodiment of the invention using the described conductive films 9, 9A, 9B will be described with reference to figures. The description will be made using the conductive film 9 hereafter, but the methods are the same even using the conductive films 9A and 9B.

Figure 2:
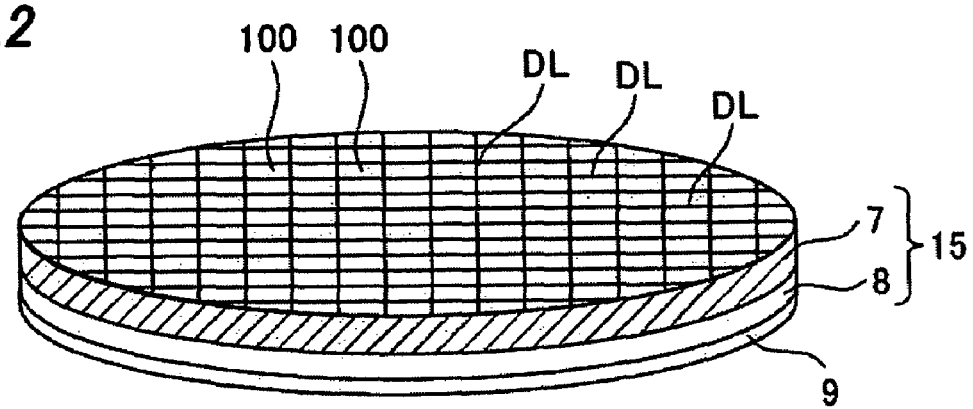
FIGS. 2, 8, and 10 are perspective views showing a chucking mechanism of the embodiment.

As shown in FIG. 2, a layered body 15 includes a semiconductor substrate 7 and a glass substrate 8 for supporting the semiconductor substrate 7. The layered body 15 is the object to be chucked. It is noted that electronic devices are formed on the surface of the semiconductor substrate 7. The separation layer 4 of the conductive film 9 is separated and removed to expose the attachment layer 3, so that the conductive film 9 is attached to the glass substrate 8 with this attachment layer 3 therebetween. The layered body 15 forms a shape of a disk-like semiconductor wafer. The semiconductor substrate 7 has a large number of semiconductor integrated circuits 100 sectioned in a matrix by a dicing line DL. Although the glass substrate 8 is used as a supporting body of the semiconductor substrate 7, the other insulator of a ceramic, quartz, a plastic, or a resin, e.g., a resist or an epoxy resin, can be used as the supporting body.

Figure 3:
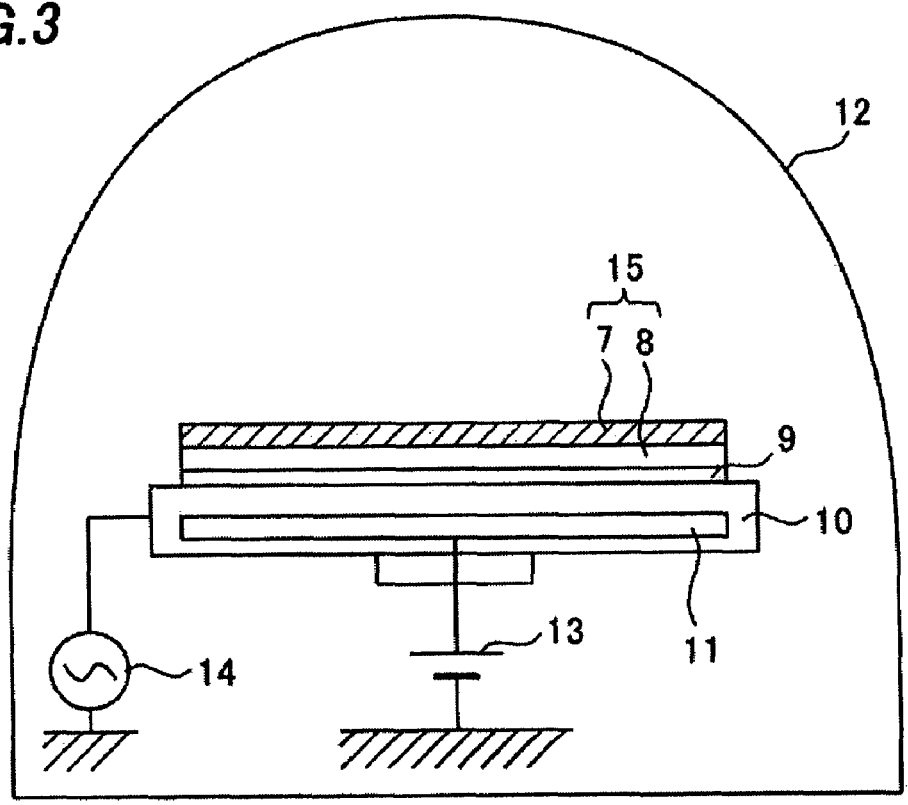
FIGS. 3 to 7 are cross-sectional views showing process steps applied to the object chucked in the manner shown in FIG. 2.

Then, as shown in FIG. 3, the layered body 15 attached with the conductive film 9 is set on a stage 10 set in a vacuum chamber 12 of a dry-etching apparatus or the like. At this time, the surface of the stage 10 is covered with a dielectric layer (not shown). A power supply 13 is to supply a DC voltage or an AC voltage to an internal electrode, and an AC power supply 14 is to supply an AC voltage to the stage 10.

Then, after the layered body 15 is set on the stage 10, a voltage is applied to an internal electrode 11 provided in the stage 10 to generate positive and negative electric charges on the surfaces of the conductive film 9 and the stage 10, and the layered body 15 is chucked on the stage 10 with static electricity generated therebetween. Then, the semiconductor substrate 7 of the chucked layered body 15 is processed by dry-etching, CVD (chemical vapor deposition), or PVD (physical vapor deposition), in a vacuum state.

Figure 4A:
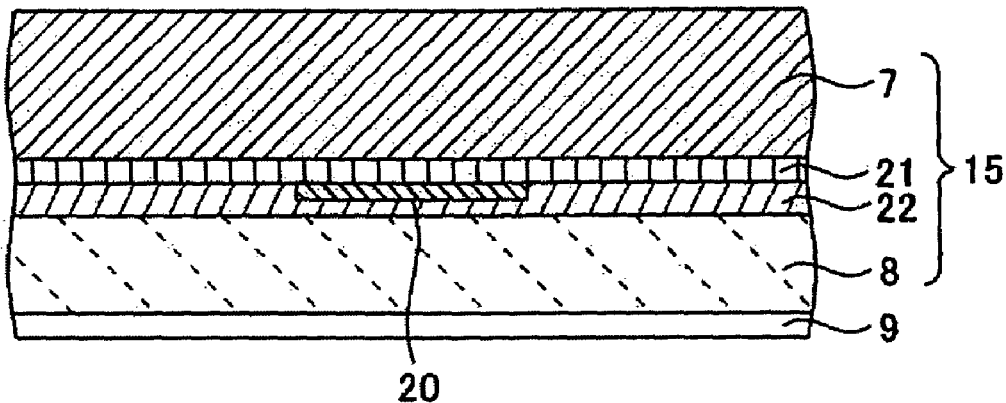

Next, the processing of the described layered body 15 will be described in detail. FIGS. 4A to 6 are partial cross-sectional views of the layered body 15 in process order. First, as shown in FIG. 4A, a pad electrode 20 as well as electronic devices (not shown) (e.g. a CCD (Charge Coupled Device), a light receiving element such as an infrared ray sensor, or a light emissive element) is formed on a front surface of the semiconductor substrate 7, the pad electrode 20 being connected with these electronic devices. The pad electrode 20 is formed on the front surface of the semiconductor substrate 7 with an interlayer insulation film 21 therebetween.

The semiconductor substrate 7 is formed of, for example, silicon (Si), and preferably has a thickness of about 20 to 200 $\mu m$. The pad electrode 20 is formed of, for example, aluminum (Al), and preferably has a thickness of about 1 $\mu m$. It is noted that a passivation film (not shown) is formed on the semiconductor substrate 7, covering at least a part of the pad electrode 20. The interlayer insulation film 21 is formed of, for example, an oxide film, and preferably has a thickness of about 0.8 $\mu m$. Then, the glass substrate 8 having a thickness of about 80 to 100 $\mu m$ is attached on the front surface of the semiconductor substrate 7 with a resin layer 22 therebetween. The conductive film 9 is then attached to the front surface of the glass substrate 8.

Figure 4B:
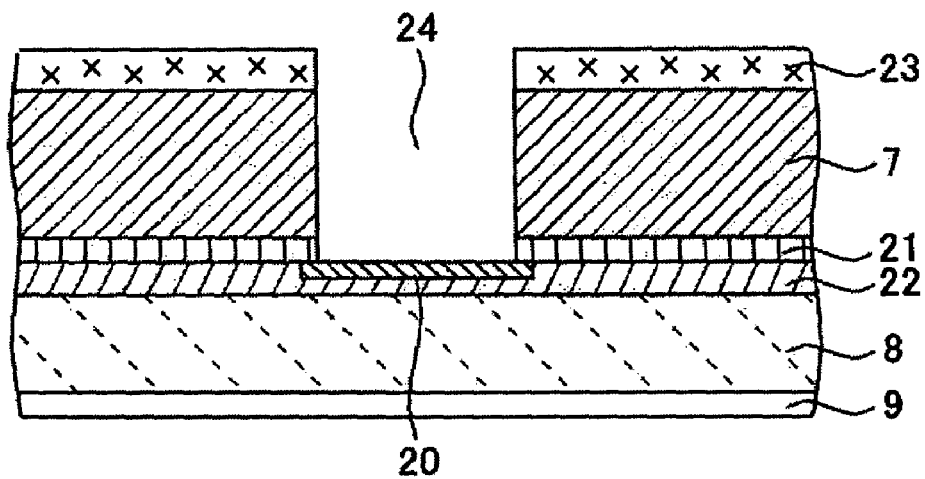

Next, as shown in FIG. 4B, a resist layer 23 is selectively formed on a back surface of the semiconductor substrate 7. Then, the layered body 15 formed with the resist layer 23 and attached with the conductive film 9 is set on the stage 10 in the vacuum chamber 12 of the dry-etching apparatus, with the conductive film 9 opposed to the stage 10. Then, the layered body 15 thus set is electrostatically chucked thereon, and the semiconductor substrate 7 is dry-etched. As etching gas for the dry-etching, $CHF_3$ or the like can be used, for example. A via hole 24 is formed by this dry-etching, penetrating the semiconductor substrate 7 and the interlayer insulation film 21 in a position corresponding to the pad electrode 20.

Figure 4C:
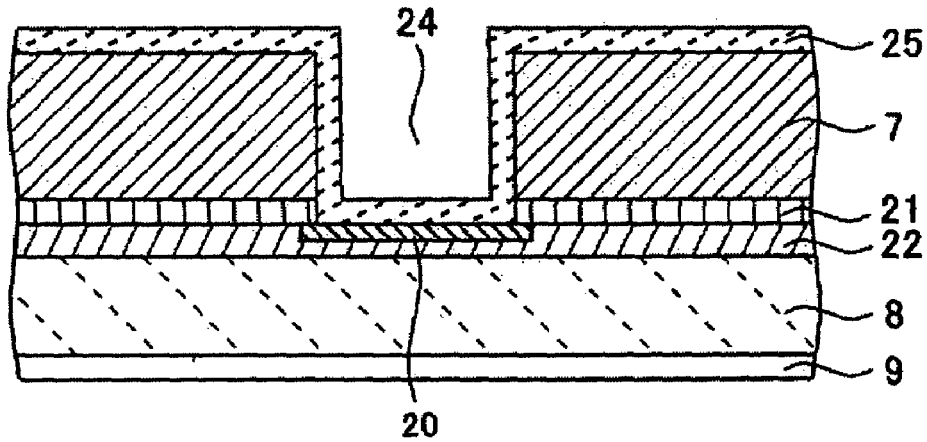

Next, after the resist layer 23 is removed, as shown in FIG. 4C, an insulation film 25 is formed on the whole back surface of the semiconductor substrate 7 including in the via hole 24 by a CVD (chemical vapor deposition) method. The insulation film 25 is formed of, for example, a silicon oxide film ($SiO_2$ film) or a silicon nitride film (SiN film), and formed by a plasma CVD apparatus of an electrostatic chuck type.

Figure 5A:
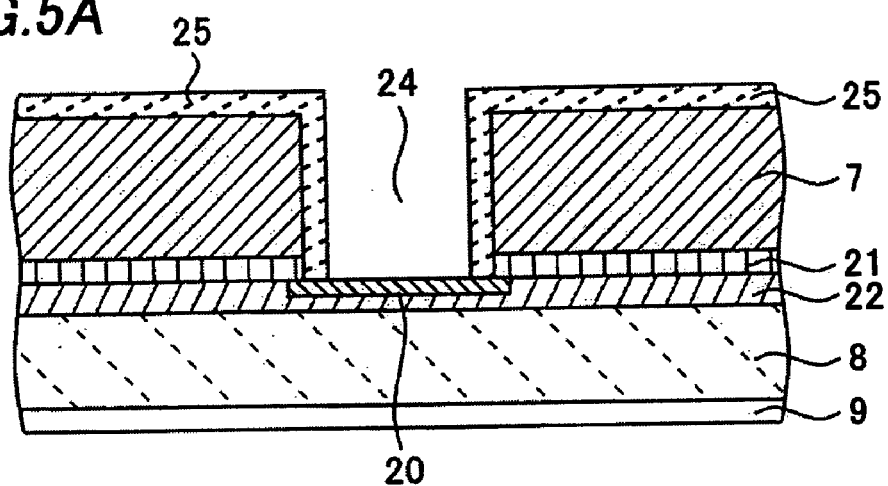

Next, as shown in FIG. 5A, a resist layer (not shown) is formed on the insulation film 25, and the insulation film 25 at a bottom of the via hole 24 is dry-etched and removed using the resist layer as a mask. In this dry-etching process, too, the layered body 15 can be electrostatically chucked in the same manner as described above.

Figure 5B:
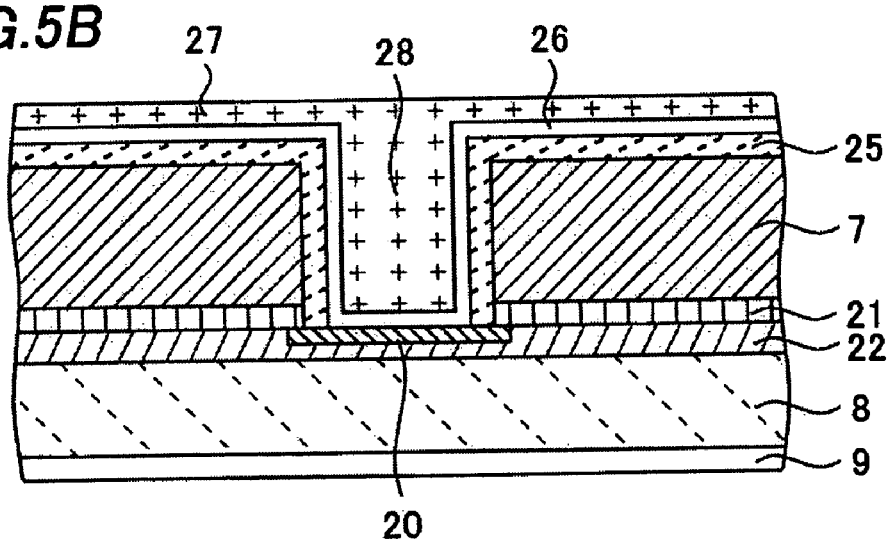

Next, as shown in FIG. 5B, a barrier metal layer 26 is formed on the insulation film 25 on the back surface of the semiconductor substrate 7 including in the via hole 24. Furthermore, a seed layer (not shown) is formed on the barrier metal layer 26. The barrier metal layer 26 is formed of metal, for example, a titanium tungsten (TiW) layer, a titanium nitride (TiN) layer, a tantalum nitride (TaN) layer, or the like. The seed layer (not shown) is to be an electrode for forming a wiring layer 27 by plating, which will be described below, and formed of, for example, copper (Cu). The barrier metal layer 26 can be formed by a PVD (physical vapor deposition) method, and at this time the layered body 15 can be electrostatically chucked in a PVD apparatus in the same manner as described above.

Next, a penetrating electrode 28 formed of copper (Cu) and a wiring layer 27 continued and connected to the penetrating electrode 28 are formed on the barrier metal layer 26 and the seed layer (not shown) including in the via hole 24 by an electrolytic plating method, for example. The penetrating electrode 28 and the wiring layer 27 are electrically connected with the pad electrode 20 exposed at the bottom of the via hole 24 with the barrier metal layer 26 and the seed layer (not shown) therebetween.

Figure 5C:
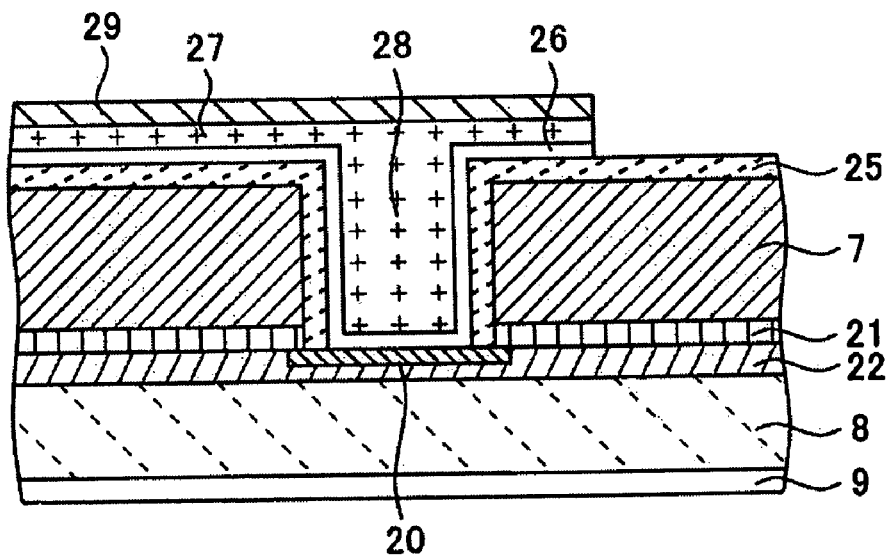

Next, as shown in FIG. 5C, a resist layer 29 for patterning the wiring layer 27 in a predetermined pattern is selectively formed on the wiring layer 27 on the back surface of the semiconductor substrate 7. Then, an unnecessary portion of the wiring layer 27 and the seed layer (not shown) is etched and removed using the resist layer 29 as a mask. Then, the barrier metal layer 26 is etched and removed using the wiring layer 27 as a mask. When these etching processes are performed by a dry-etching method, the layered body 15 can be electrostatically chucked in the dry-etching apparatus in the same manner as described above.

Figure 6:
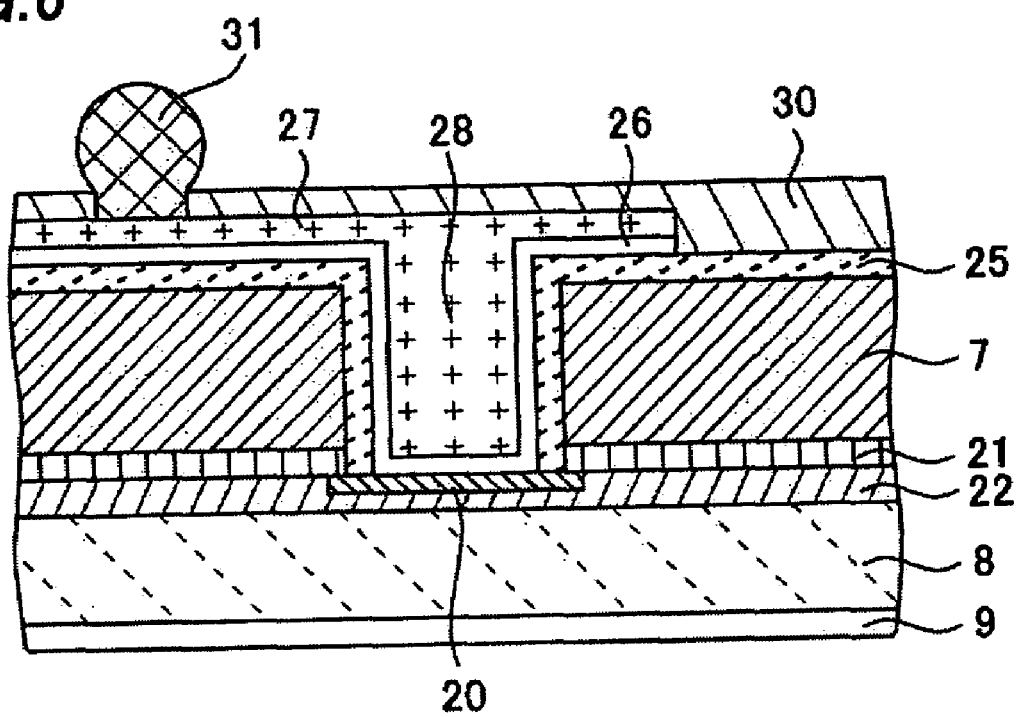

Next, as shown in FIG. 6, a protection layer 30 formed of, for example, a resist material such as a solder resist is formed on the back surface of the semiconductor substrate 7 so as to cover the substrate 7. An opening is formed in the protection layer 30 in a position corresponding to the wiring layer 27. Then, a ball-shaped conductive terminal 31 formed of, for example, metal such as solder is formed on the wiring layer 27 exposed in the opening by a screen printing method. It is noted that the invention can be applied to a semiconductor device that does not have the conductive terminal 31, that is, a so-called LGA (land grid array) type semiconductor device.

Then, this layered body 15 is diced along a dicing line DL, and separated into individual dies. The conductive film 9 is separated and removed from the layered body 15 before or after this dicing process. As described above, in the method described above it is possible to use the electrostatic chucking for all the steps to be performed in a vacuum state such as the dry-etching, CVD (chemical vapor deposition), PVD (physical vapor deposition) processes usually performed in a manufacturing process of a semiconductor device having an insulator such as the glass substrate 8. This can provide uniformity of the temperature distribution and prevent the layered body 15 warping, thereby enhancing the yield.

Figure 7:
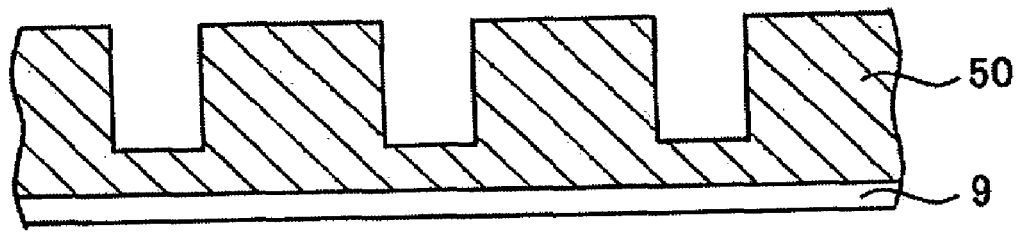

Furthermore, although the electrostatic chucking is performed to the layered body 15 of the semiconductor substrate 7 and the glass substrate 8 in the embodiment, the embodiment can be similarly applied to the insulator 50 formed of glass, a ceramic, quartz, a plastic, a resin, e.g., a resist or an epoxy resin, or the like as shown in FIG. 7. That is, the conductive film 9 is attached on a surface of the insulator 50, and the insulator 50 is electrostatically chucked on the stage 10 set in the vacuum chamber 12 of the dry-etching apparatus or the like as shown in FIG. 3, with the conductive film 9 being opposed to the stage 10. Then, this insulator 50 is processed by dry-etching, CVD (chemical vapor deposition), or PVD (physical vapor deposition) in a vacuum state, while being electrostatically chucked.

Figure 8:
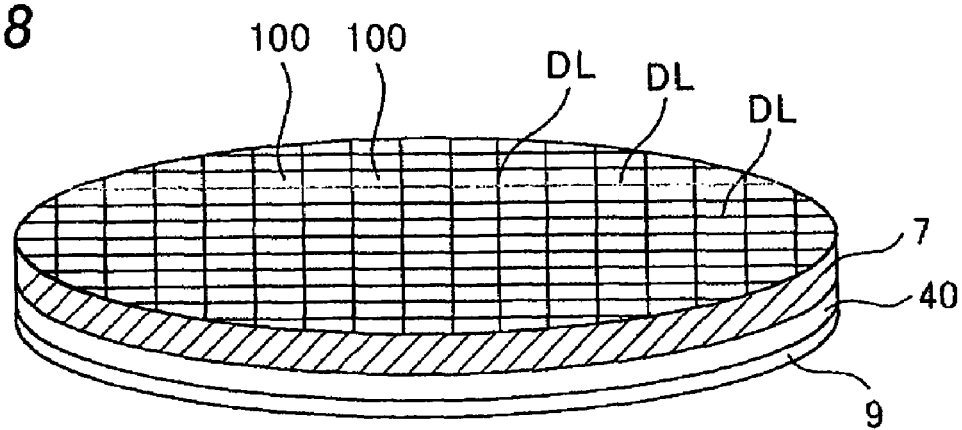

Furthermore, although the conductive film 9 is provided on the surface of the glass substrate 8 or the insulator 50 formed of a ceramic, quartz, a plastic, a resin or the like in the described embodiment, it is possible, as shown in FIG. 8, that the conductive film 9 is provided on an insulation film 40, e.g., a silicon oxide film, a silicon nitride film or a resin layer, formed on the semiconductor substrate 7 and electrostatically chucked in the similar manner, and processes such as dry-etching, CVD, or PVD are performed to the semiconductor substrate 7.

Figure 9:
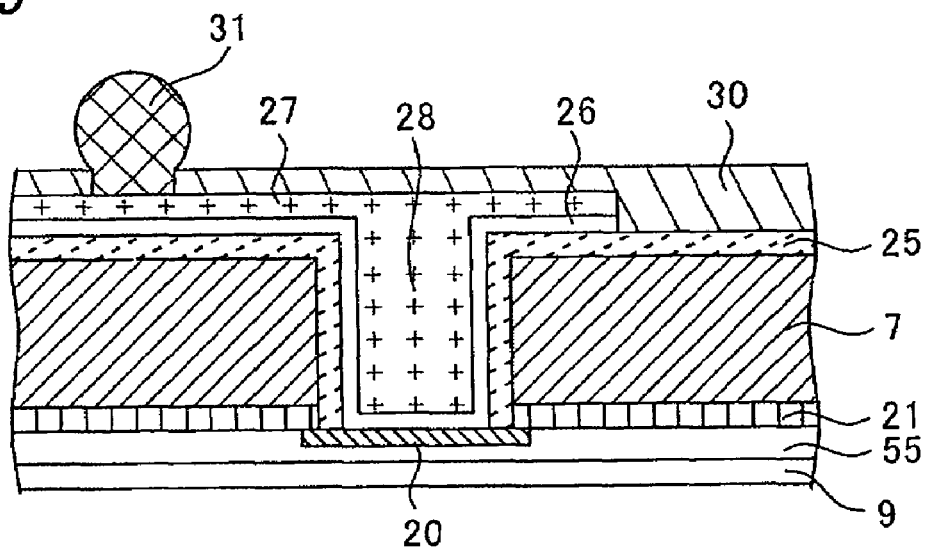
FIG. 9 is a cross-sectional view showing process steps applied to the object chucked in the manner shown in FIG. 8.

In detail, as shown in FIG. 9, the conductive film 9 is directly provided on a passivation film 55 as the insulation film 40 formed on the surface of the semiconductor substrate 7 and electrostatically chucked, and various processes in the semiconductor manufacturing process can be performed to this assembly. This case has an advantage that the semiconductor substrate 7 can be chucked with static electricity more firmly and processing accuracy can be enhanced. This is effective particularly in the case of the thick insulation film 40. Furthermore, the conductive film 9 functions as a support body such as the glass substrate 8, so that there is an advantage that the required semiconductor device can be manufactured without using the support body such as the glass substrate 8. Since the other structure in FIG. 9 is the same as in FIG. 6, the same numerals are provided and the description is omitted.

Figure 10:
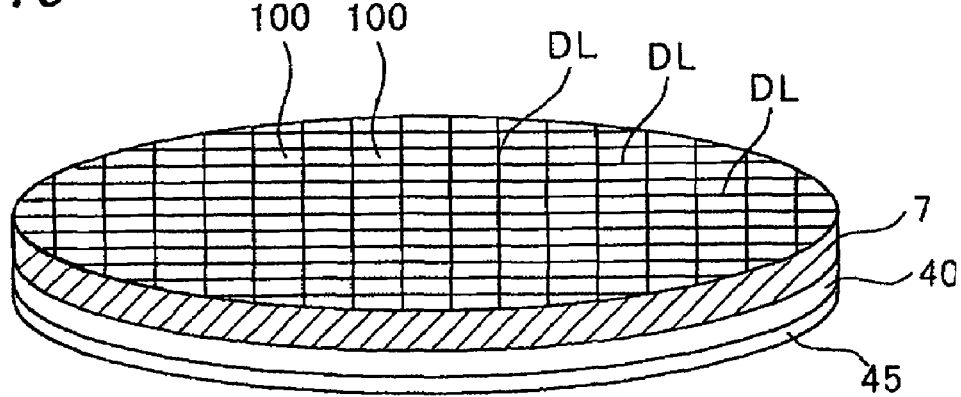

The above description is made with the conductive film 9, but the other conductive member can be used and also has the similar effect in electrostatic chucking. That is, a conductive resin is prepared by mixing a resin, such as a resist or an epoxy resin, and the same conductive material as the conductive material of the conductive film 9, and a conductive resin layer 45 is formed on the surface of an insulation substrate formed of a glass, a ceramic, quartz, or a plastic or the surface of the insulation film 40 formed on the surface of the semiconductor substrate 7, as shown in FIG. 10, using the conductive resin. Then, the insulation substrate or the semiconductor substrate 7 is electrostatically chucked in the similar manner, and the processes are performed to this assembly. In this case, the conductive resin layer 45 can be used as a support body such as the glass substrate 8. The conductive resin layer 45 is to be separated and removed like the conductive film 9 after the insulation substrate or the semiconductor substrate 7 is processed.

What is claimed is:

1. A method of chucking, comprising:
   providing an object comprising a surface portion that is made of an insulator;
   attaching a member comprising a conductive layer to the surface portion using an adhesive;
   placing the object to which the member is attached in a vacuum chamber; and
   chucking the object to which the member is attached to a stage provided in the vacuum chamber by generating electrostatic charges between the member and the stage.

2. The method of claim 1, wherein the insulator comprises a glass, a ceramic, quartz, a plastic, or a resin.

3. The method of claim 1, wherein the member further comprises a protection layer and an adhesive layer.

4. The method of claim 1, wherein the member further comprises a protection layer, a polyimide layer and an adhesive layer.

5. The method of claim 1, wherein the member further comprises a protection layer, a polymer layer formed by polymerizing a conductive material and polyimide, and an adhesive layer.

6. The method of claim 1, wherein the member comprises a conductive resin layer.

7. A method of chucking, comprising:
   providing an object for chucking;
   attaching a substrate made of an insulator to the object;
   attaching a member comprising a conductive layer to the substrate after the attaching of the substrate to the object;
   placing the object to which the member and the substrate are attached in a vacuum chamber; and
   chucking the object to which the member and the substrate are attached to a stage provided in the vacuum chamber by generating electrostatic charges between the member and the stage.

8. The method of claim 7, wherein the insulator comprises a glass, a ceramic, quartz, a plastic, or a resin.

9. The method of claim 7, wherein the member further comprises a protection layer and an adhesive layer.

10. The method of claim 7 wherein the member further comprises a protection layer, a polyimide layer and an adhesive layer.

11. The method of claim 7, wherein the member further comprises a protection layer, a polymer layer formed by polymerizing a conductive material and polyimide, and an adhesive layer.

12. The method of claim 7, wherein the object comprises a semiconductor wafer, an insulator or a conductor.

13. The method of claim 7, wherein the member comprises a conductive resin layer.

14. A method of processing objects, comprising:
   providing an object comprising a surface portion that is made of an insulator;
   attaching a member comprising a conductive layer to the surface portion using an adhesive;
   placing the object to which the member is attached in a vacuum chamber;
   chucking the object to which the member is attached to a stage provided in the vacuum chamber by generating electrostatic charges between the member and the stage; and processing the object chucked to the stage in the vacuum chamber.

15. The method of claim 14, wherein the insulator comprises a glass, a ceramic, quartz, a plastic, or a resin.

16. The method of claim 14, wherein the processing of the chucked object comprises a dry-etching, a chemical vapor deposition or physical vapor deposition.

17. The method of claim 14, wherein the member further comprises a protection layer and an adhesive layer.

18. The method of claim 14, wherein the member further comprises a protection layer, a polyimide layer and an adhesive layer.

19. The method of claim 14, wherein the member further comprises a protection layer, a polymer layer formed by polymerizing a conductive material and polyimide, and an adhesive layer.

20. The method of claim 14, wherein the member comprises a conductive resin layer.

21. A method of processing an object, comprising:
attaching a substrate made of an insulator to the object;
attaching a member comprising a conductive layer to the substrate, after the attaching of the substrate to the object;
placing the object to which the member and the substrate are attached in a vacuum chamber;
chucking the object to which the member and the substrate are attached to a stage provided in the vacuum chamber by generating electrostatic charges between the member and the stage; and
processing the object chucked to the stage in the vacuum chamber.

22. The method of claim 21, wherein the insulator comprises a glass, a ceramic, quartz, a plastic, or a resin.

23. The method of claim 21, wherein the processing of the chucked object comprises a dry-etching, a chemical vapor deposition or physical vapor deposition.

24. The method of claim 21, wherein the member further comprises a protection layer and an adhesive layer.

25. The method of claim 21, wherein the member further comprises a protection layer, a polyimide layer and an adhesive layer.

26. The method of claim 21, wherein the member further comprises a protection layer, a polymer layer formed by polymerizing a conductive material and polyimide, and an adhesive layer.

27. The method of claim 21, wherein the object comprises a semiconductor wafer, an insulator or a conductor.

28. The method of claim 21, wherein the member comprises a conductive resin layer.

29. The method of claim 1, further comprising:
processing the object chucked to the stage in the vacuum chamber, and
removing the member from the surface portion of the object after the processing of the object.

30. The method of claim 7, further comprising:
processing the object chucked to the stage in the vacuum chamber, and
removing the member from the substrate after the processing of the object.

31. The method of claim 14, further comprising:
removing the member from the surface portion of the object after the processing of the object.

32. The method of claim 21, further comprising:
removing the member from the substrate after the processing of the object.

* * * * *